(12) United States Patent
Kim et al.

(10) Patent No.: US 10,475,494 B2
(45) Date of Patent: Nov. 12, 2019

(54) MEMORY DEVICE AND MEMORY SYSTEM INCLUDING THE SAME

(71) Applicant: SK hynix Inc., Gyeonggi-do (KR)

(72) Inventors: Woongrae Kim, Gyeonggi-do (KR); Tae-Yong Lee, Seoul (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/122,350

(22) Filed: Sep. 5, 2018

(65) Prior Publication Data

US 2019/0214068 A1 Jul. 11, 2019

(30) Foreign Application Priority Data

Jan. 11, 2018 (KR) .................. 10-2018-0003758

(51) Int. Cl.
  *G11C 8/00* (2006.01)
  *G11C 8/18* (2006.01)
  *G11C 8/06* (2006.01)
  *G11C 8/10* (2006.01)

(52) U.S. Cl.
  CPC .................. *G11C 8/18* (2013.01); *G11C 8/06* (2013.01); *G11C 8/10* (2013.01)

(58) Field of Classification Search
  CPC ................ G11C 8/18; G11C 8/06; G11C 8/10
  USPC ..................................................... 365/230.06
  See application file for complete search history.

(56) References Cited

U.S. PATENT DOCUMENTS

2007/0297270 A1* 12/2007 Komatsu .................. G11C 8/08
                                                                365/233.1

FOREIGN PATENT DOCUMENTS

KR         1020160001098         1/2016

* cited by examiner

*Primary Examiner* — Huan Hoang
(74) *Attorney, Agent, or Firm* — IP & T Group LLP

(57) ABSTRACT

A semiconductor device may include: a holding control circuit suitable for generating a holding control signal and an option setting information signal, based on a first command signal; a holding circuit suitable for generating a held option setting information signal based on the holding control signal and the option setting information signal; an operation control circuit suitable for generating an operation mode signal based on a second command signal; a setting control circuit suitable for generating a setting control signal based on the operation mode signal and the held operation setting information signal; and a memory region suitable for performing an operation based on the setting control signal and the operation mode signal.

19 Claims, 12 Drawing Sheets

MEMORY DEVICE AND MEMORY SYSTEM INCLUDING THE SAME

CROSS-REFERENCE TO RELATED APPLICATION

This application claims priority under 35 U.S.C. § 119 to Korean Patent Application No. 10-2018-0003758 filed on Jan. 11, 2018, which is incorporated herein by reference in its entirety.

BACKGROUND

1. Field

Exemplary embodiments relate to a memory device and a memory system including the same.

2. Discussion of the Related Art

Generally, a memory system includes a control device and a memory device. The control device generates a command signal for controlling the memory device, and the memory device performs a predetermined operation based on the command signal. At this time, the number of times that the control device generates the command signal is related to processing speed performance and power overhead depending on the throughput of the command signal. Therefore, it is required to minimize the number of times that the control device generates the command signal.

SUMMARY

Various embodiments are directed to a memory device capable of optimally using command signals classified according to the use, and a memory system including the same.

In an embodiment, a memory device may include: a holding control circuit suitable for generating a holding control signal and an option setting information signal, based on a first command signal; a holding circuit suitable for generating a held option setting information signal based on the holding control signal and the option setting information signal; an operation control circuit suitable for generating an operation mode signal based on a second command signal; a setting control circuit suitable for generating a setting control signal based on the operation mode signal and the held operation setting information signal; and a memory region suitable for performing an operation based on the setting control signal and the operation mode signal.

In an embodiment, a memory device may include: a holding control circuit suitable for generating a holding control signal and an option setting information signal based on a first command signal, during a holding period; a holding circuit suitable for generating a held option setting information signal based on the holding control signal and the option setting information signal during the holding period, and retaining the held option setting information signal during an operation period following the holding period; an operation control circuit suitable for generating an operation mode signal and an address signal based on a second command signal, during the operation period; a setting control circuit suitable for generating a setting control signal based on the held option setting information signal and the operation mode signal, during the operation period; and a memory region suitable for performing a write operation or read operation based on the setting control signal, the operation mode signal and the address signal.

In an embodiment, a memory device may include: a holding control circuit suitable for generating a synchronized holding control signal and an option setting information signal based on a first command signal including one or more first code signals and one or more second code signals, during a holding period; a holding circuit suitable for generating a held option setting information signal based on the synchronized holding control signal and the option setting information signal during the holding period, and retaining the held option setting information signal during an operation period following the holding period; an operation control circuit suitable for generating an operation mode signal and an address signal based on a second command signal, during the operation period; a setting control circuit suitable for generating a setting control signal based on the held operation setting information signal and the operation mode signal, during the operation period; and a memory region suitable for performing a write operation or read operation based on the setting control signal, the operation mode signal and the address signal. The holding control circuit may include: a first decoding unit suitable for generating the holding control signal based on the first code signal; a synchronization unit suitable for generating a synchronized holding control signal by synchronizing the holding control signal with a control clock signal; and a second decoding unit suitable for generating the option setting information signal based on the synchronized holding control signal and the second code signal. The holding circuit may include an asynchronous latch.

In an embodiment, a memory system may include: a control device suitable for generating a first command signal corresponding to first option setting information during a first holding period, and generating a second command signal corresponding to a first operation mode during a first operation period; and a memory device suitable for holding the first command signal, and performing an operation according to the first option setting information and the first operation mode based on the second command signal and the held first command signal.

In an embodiment, an operating method for a memory system may include: generating, by a control device, a first command signal corresponding to first option setting information during a first holding period, and generating a second command signal corresponding to a first operation mode during a first operation period; and holding the first command signal and performing an operation, by a memory device, according to the first option setting information and the first operation mode based on the second command signal and the held first command signal.

DETAILED DESCRIPTION

Figure 1:
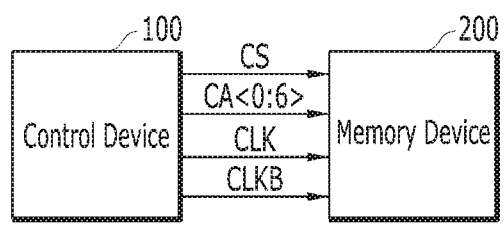
FIG. 1 is a block diagram illustrating a memory system in accordance with an embodiment.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a memory system in accordance with an embodiment.

Referring to FIG. 1, the memory system may include a control device 100 and a memory device 200.

The control device 100 may generate option commands corresponding to option setting information as command signals CS and CA<0:6> during a holding period. The control device 100 may generate operation command signals corresponding to an operation mode as the command signals CS and CA<0:6> during an operation period following the holding period.

The operation period may include a write operation period, a read operation mode and the like, and the operation mode may include a write mode, a read mode and the like. The command signals CS and CA<0:6> may include a select command signal CS and first to seventh command signals CA<0:6>. The option setting information will be described in detail later.

In particular, the control device 100 may generate the option command signals once, and then generate the operation command signals one or more times. That is, the control device 100 may generate the option command signals only when an update is needed, regardless of the number of times that the control device 100 generates the operation command signals.

For example, during a first holding period, the control device 100 may generate first option command signals corresponding to first option setting information as the command signals CS and CA<0:6>. During a first operation period, the control device 100 may generate first operation command signals corresponding to a first operation mode as the command signals CS and CA<0:6>. During a second operation period, the control device 100 may generate second operation command signals corresponding to a second operation mode as the command signals CS and CA<0:6>. During a second holding period, the control device 100 may generate second option command signals corresponding to second option setting information as the command signals CS and CA<0:6>.

The first option setting information and the second option setting information may be different from each other. The first operation mode and the second operation mode may be equal to or different from each other.

The control device 100 may output the command signals CS and CA<0:6> and differential clock signals CLK and CLKB to the memory device 200.

The memory device 200 may perform an operation according to the option setting information and the operation mode, based on the command signals CS and CA<0:6> and the differential clock signals CLK and CLKB.

For example, the memory device 200 may hold the first option command signals when the first option command signals are received, and perform a first operation based on the first operation command signals and the held first option command signals when the first operation command signals are received. Furthermore, when the second operation command signals are received while the first option command signals are held, the memory device 200 may perform a second operation based on the second operation command signals and the held first option command signals. Furthermore, when the second option command signals are received while the first option command signals are held, the memory device 200 may hold the second operation command signals instead of the first option command signals. That is, the memory device 200 may update the first option setting information into the second option setting information.

Figure 2:
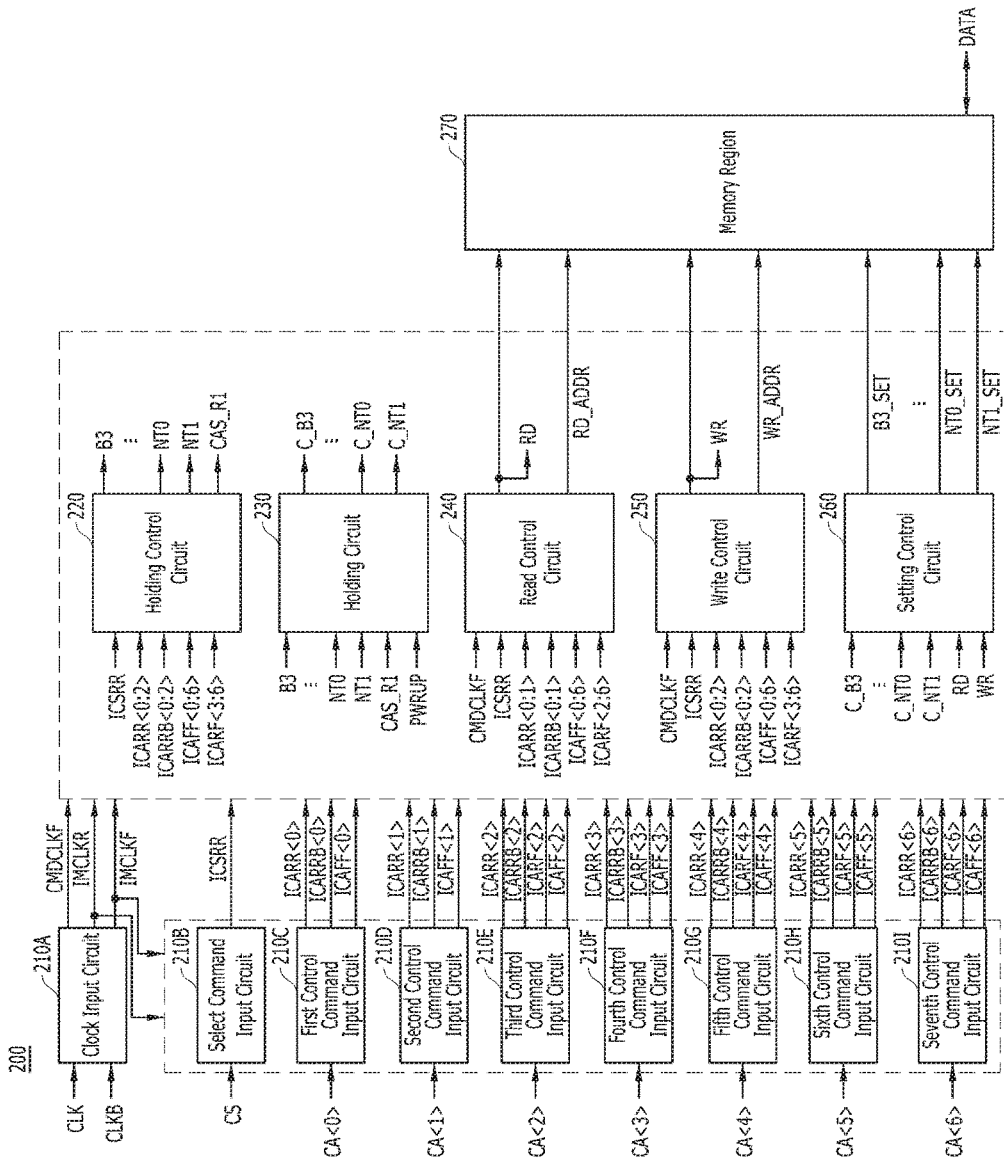
FIG. 2 is a block diagram illustrating a memory device in accordance with an embodiment.

FIG. 2 is a block diagram illustrating a memory device in accordance with an embodiment, for example, the memory device 200 of FIG. 1.

Referring to FIG. 2, the memory device 200 may include a clock input circuit 210A, a select command input circuit 210B, first to seventh control command input circuits 210C to 210I, a holding control circuit 220, a holding circuit 230, a read control circuit 240, a write control circuit 250, a setting control circuit 260 and a memory region 270.

The clock input circuit 210A may generate first to third control clock signals IMCLKR, IMCLKF and CMDCLKF based on the differential clock signals CLK and CLKB. For example, the clock input circuit 210A may generate the first control clock signal IMCLKR synchronized with a rising edge of the first clock signal CLK of the differential clock signals CLK and CLKB. The clock input circuit 210A may generate the second control clock signal IMCLKF synchronized with a falling edge of the first clock signal CLK. The clock input circuit 210A may generate the third control clock signal CMDCLKF by delaying the second control clock signal IMCLKF by a predetermined delay time.

The select command input circuit 210B may generate a select code signal ICSRR based on the select command signal CS and the first control clock signal IMCLKR. For example, the select command input circuit 210B may synchronize the select command signal CS with the first control clock signal IMCLKR, and output the synchronized signal as the select code signal ICSRR.

The first control command input circuit 210C may generate a control code signal ICARR<0>, a control code signal ICARRB<0> and a control code signal ICAFF<0>, based on the first control command signal CA<0> and the first and second control clock signals IMCLKR and IMCLKF. For example, the first control command input circuit 210C may synchronize the first control command signal CA<0> with the first control clock signal IMCLKR, and output the synchronized signal as the control code signal ICARR<0>. Furthermore, the first control command input circuit 210C may invert the control code signal ICARR<0>, and output the inverted signal as the control code signal ICARRB<0>. Furthermore, the first control command input circuit 210C may synchronize the first control command signal CA<0> with the second control clock signal IMCLKF, and output the synchronized signal as the control code signal ICAFF<0>.

The second control command input circuit 210D may generate a control code signal ICARR<1>, a control code signal ICARRB<1> and a control code signal ICAFF<1>, based on the second control command signal CA<1> and the first and second control clock signals IMCLKR and IMCLKF. For example, the second control command input circuit 210D may synchronize the second control command signal CA<1> with the first control clock signal IMCLKR, and output the synchronized signal as the control code signal ICARR<1>. Furthermore, the second control command input circuit 210D may invert the control code signal ICARR<1>, and output the inverted signal as the control code signal ICARRB<1>. Furthermore, the second control command input circuit 210D may synchronize the second control command signal CA<1> with the second control clock signal IMCLKF, and output the synchronized signal as the control code signal ICAFF<1>.

The third control command input circuit 210E may generate a control code signal ICARR<2>, a control code signal ICARRB<2>, a control code signal ICAFF<2> and a control code signal ICARF<2>, based on the third control command signal CA<2> and the first and second control clock signals IMCLKR and IMCLKF. For example, the third control command input circuit 210E may synchronize the third control command signal CA<2> with the first control clock signal IMCLKR, and output the synchronized signal as the control code signal ICARR<2>. Furthermore, the third control command input circuit 210E may invert the control code signal ICARR<2>, and output the inverted signal as the control code signal ICARRB<2>. Furthermore, the third control command input circuit 210E may synchronize the third control command signal CA<2> with the second control clock signal IMCLKF, and output the synchronized signal as the control code signal ICAFF<2>. Furthermore, the third control command input circuit 210E may synchronize the control code signal ICARR<2> with the second control clock signal IMCLKF, and output the synchronized signal as the control code signal ICARF<2>.

The fourth control command input circuit 210F may generate a control code signal ICARR<3>, a control code signal ICARRB<3>, a control code signal ICAFF<3> and a control code signal ICARF<3>, based on the fourth control command signal CA<3> and the first and second control clock signals IMCLKR and IMCLKF. For example, the fourth control command input circuit 210F may synchronize the fourth control command signal CA<3> with the first control clock signal IMCLKR, and output the synchronized signal as the control code signal ICARR<3>. Furthermore, the fourth control command input circuit 210F may invert the control code signal ICARR<3>, and output the inverted signal as the control code signal ICARRB<3>. Furthermore, the fourth control command input circuit 210F may synchronize the fourth control command signal CA<3> with the second control clock signal IMCLKF, and output the synchronized signal as the control code signal ICAFF<3>. Furthermore, the fourth control command input circuit 210F may synchronize the control code signal ICARR<3> with the second control clock signal IMCLKF, and output the synchronized signal as the control code signal ICARF<3>.

The fifth control command input circuit 210G may generate a control code signal ICARR<4>, a control code signal ICARRB<4>, a control code signal ICAFF<4> and a control code signal ICARF<4>, based on the fifth control command signal CA<4> and the first and second control clock signals IMCLKR and IMCLKF. For example, the fifth control command input circuit 210G may synchronize the fifth control command signal CA<4> with the first control clock signal IMCLKR, and output the synchronized signal as the control code signal ICARR<4>. Furthermore, the fifth control command input circuit 210G may invert the control code signal ICARR<4>, and output the inverted signal as the control code signal ICARRB<4>. Furthermore, the fifth control command input circuit 210G may synchronize the fifth control command signal CA<4> with the second control clock signal IMCLKF, and output the synchronized signal as the control code signal ICAFF<4>. Furthermore, the fifth control command input circuit 210G may synchronize the control code signal ICARR<4> with the second control clock signal IMCLKF, and output the synchronized signal as the control code signal ICARF<4>.

The sixth control command input circuit 210H may generate a control code signal ICARR<5>, a control code signal ICARRB<5>, a control code signal ICAFF<5> and a control code signal ICARF<5>, based on the sixth control command signal CA<5> and the first and second control clock signals IMCLKR and IMCLKF. For example, the sixth control command input circuit 210H may synchronize the sixth control command signal CA<5> with the first control clock signal IMCLKR, and output the synchronized signal as the control code signal ICARR<5>. Furthermore, the sixth control command input circuit 210H may invert the control code signal ICARR<5>, and output the inverted signal as the control code signal ICARRB<5>. Furthermore, the sixth control command input circuit 210H may synchronize the sixth control command signal CA<5> with the second control clock signal IMCLKF, and output the synchronized signal as the control code signal ICAFF<5>. Furthermore, the sixth control command input circuit 210H may synchronize the control code signal ICARR<5> with the second control clock signal IMCLKF, and output the synchronized signal as the control code signal ICARF<5>.

The seventh control command input circuit 210I may generate a control code signal ICARR<6>, a control code signal ICARRB<6>, a control code signal ICAFF<6> and a control code signal ICARF<6>, based on the seventh control command signal CA<6> and the first and second control clock signals IMCLKR and IMCLKF. For example, the seventh control command input circuit 210I may synchronize the seventh control command signal CA<6> with the first control clock signal IMCLKR, and output the synchronized signal as the control code signal ICARR<6>. Furthermore, the seventh control command input circuit 210I may invert the control code signal ICARR<6>, and output the inverted signal as the control code signal ICARRB<6>. Furthermore, the seventh control command input circuit 210I may synchronize the seventh control command signal CA<6> with the second control clock signal IMCLKF, and output the synchronized signal as the control code signal ICAFF<6>. Furthermore, the seventh control command input circuit 210I may synchronize the control code signal ICARR<6> with the second control clock signal IMCLKF, and output the synchronized signal as the control code signal ICARF<6>.

The holding control circuit 220 may receive the select code signal ICSRR, the control code signals ICARR<0:2>, the control code signals ICARRB<0:2>, the control code signals ICAFF<0:6> and the control code signals ICARF<3:6>, and generate a holding control signal CAS_R1 and a plurality of option setting information signals B3, ..., NT0 and NT1. That is, the holding control circuit 220 may generate the holding control signal CAS_R1 and the plurality of option setting information signals B3, ..., NT0 and NT1, based on the select command signal CS and the first to seventh control command signals CA<0:6> during the holding period. For example, the holding control circuit 220 may generate the holding control signal CAS_R1 synchronized with a rising edge of the dock signal CLK, and generate the plurality of option setting information signals B3, ..., NT0 and NT1 synchronized with a falling edge of the clock signal CLK.

The plurality of option setting information signals B3, ..., NT0 and NT1 may include an information signal B3 related to a burst sequence and information signals NT0 and NT1 related to on-die termination.

The holding circuit 230 may generate a plurality of held option setting information signals C_B3, ..., C_NT0 and C_NT1 based on the holding control signal CAS_R1, a power-up signal PWRUP and the plurality of option setting information signals B3, ..., NT0 and NT1. For example, the holding circuit 230 may generate the plurality of held option setting information signals C_B3, ..., C_NT0 and C_NT1 during the holding period, and retain the plurality of held option setting information signals C_B3, ..., C_NT0 and C_NT1 during the operation period.

The read control circuit 240 may receive the third control clock signal CMDCLKF, the select code signal ICSRR, the control code signals ICARR<0:1>, the control code signals ICARRB<0:1>, the control code signals ICAFF<0:6> and the control code signals ICARF<2:6>, and generate a read mode signal RD and a read address signal RD_ADDR. That is, the read control circuit 240 may generate the read mode signal RD and the read address signal RD_ADDR, based on the select command signal CS, the first to seventh control command signals CA<0:6> and the third control clock signal CMDCLKF during the operation period. For example, the read control circuit 240 may generate the read mode signal RD synchronized with a rising edge of the clock signal CLK, and generate the read address signal RD_ADDR synchronized with a falling edge of the clock signal CLK.

The write control circuit 250 may receive the third control clock signal CMDCLKF, the select code signal ICSRR, the control code signals ICARR<0:2>, the control code signals ICARRB<0:2>, the control code signals ICAFF<0:6> and the control code signals ICARF<3:6>, and generate a write mode signal WR and a write address signal WR_ADDR. That is, the write control circuit 250 may generate the write mode signal WR and the write address signal WR_ADDR, based on the select command signal CS, the first to seventh control command signals CA<0:6> and the third control clock signal CMDCLKF during the operation period. For example, the write control circuit 250 may generate the write mode signal WR synchronized with a rising edge of the clock signal CLK, and generate the write address signal WR_ADDR synchronized with a falling edge of the clock signal CLK.

The setting control circuit 260 may generate a plurality of setting control signals B3_SET, ..., NT0_SET and NT1_SET, based on the read mode signal RD, the write mode signal WR, and the plurality of held option setting information signals C_B3, ..., C_NT0 and C_NT1. The setting control circuit 260 may generate the plurality of setting control signals B3_SET, ..., NT0_SET and NT1_SET during the operation period.

The memory region 270 may have a condition which is set according to the corresponding option setting information, based on one or more of the setting control signals B3_SET, ..., NT0_SET and NT1_SET, and perform a read operation based on the read mode signal RD and the read address signal RD_ADDR or perform a write operation based on the write mode signal WR and the write address signal WR_ADDR. That is, the memory region 270 may perform the read or write operation under a predetermined condition. For example, the memory region 270 may output read data to the control device 100 according to the burst sequence.

Figure 3:
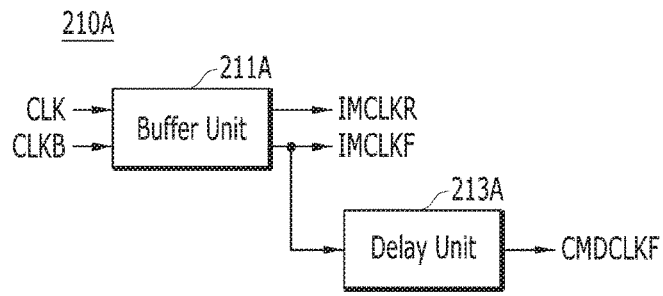
FIG. 3 is a block diagram illustrating a clock input circuit in accordance with an embodiment.

FIG. 3 is a block diagram illustrating a clock input circuit in accordance with an embodiment, for example, the clock input circuit 210A of FIG. 2.

Referring to FIG. 3, the clock input circuit 210A may include a buffer unit 211A and a delay unit 213A.

The buffer unit 211A may generate the first and control clock signals IMCLKR and IMCLKF based on the differential clock signals CLK and CLKB. For example, the buffer unit 211A may generate the first control clock signal IMCLKR synchronized with a rising edge of the first clock signal CLK, and generate the second control clock signal IMCLKF synchronized with a falling edge of the first clock signal CLK.

The delay unit 213A may generate the third control clock signal CMDCLKF by delaying the second control clock signal IMCLKF by a predetermined delay time.

Figure 4:
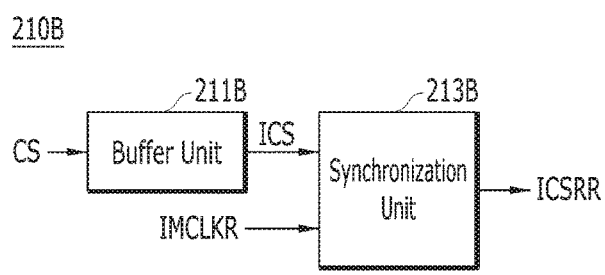
FIG. 4 is a block diagram illustrating a select command input circuit in accordance with an embodiment.

FIG. 4 is a block diagram illustrating a select command input circuit in accordance with an embodiment, for example, the select command input circuit 210B of FIG. 2.

Referring to FIG. 4, the select command input circuit 210B may include a buffer unit 211B and a synchronization unit 213B. The buffer unit 211B may generate a buffered select command signal ICS based on the select command signal CS.

The synchronization unit 213B may generate the select code signal ICSRR based on the buffered select command signal ICS and the first control clock signal IMCLKR. That is, the synchronization unit 213B may generate the select code signal ICSRR synchronized with a rising edge of the clock signal CLK.

Figure 5:
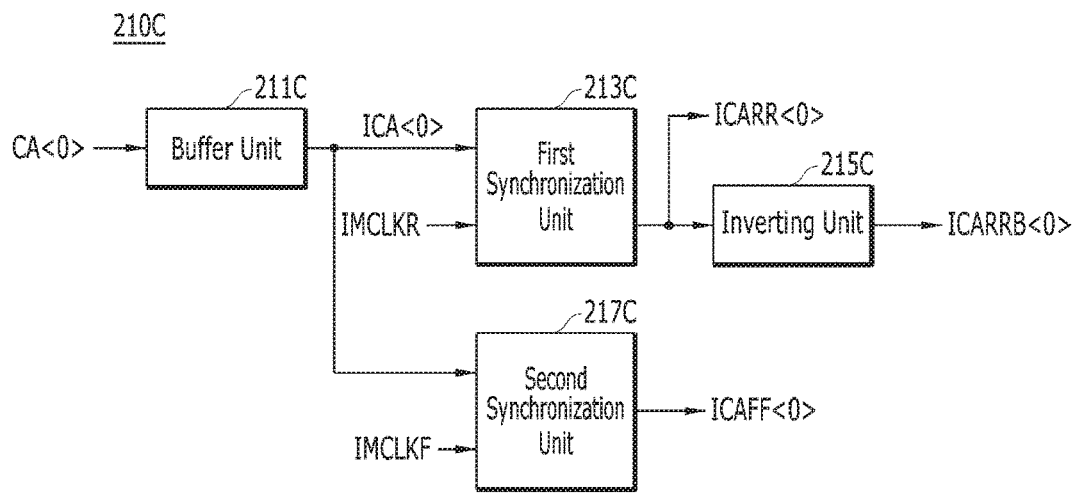
FIG. 5 is a block diagram illustrating a first control command input circuit in accordance with an embodiment.

FIG. 5 is a block diagram illustrating a first control command input circuit in accordance with an embodiment, for example, the first control command input circuit 210C of FIG. 2.

Referring to FIG. 5, the first control command input circuit 210C may include a buffer unit 211C, a first synchronization unit 213C, an inverting unit 215C and a second synchronization unit 217C.

The buffer unit 211C may generate a buffered first control command signal ICA<0> based on the first control command signal CA<0>.

The first synchronization unit 213C may generate the control code signal ICARR<0> based on the buffered first control command signal ICA<0> and the first control clock signal IMCLKR. That is, the first synchronization unit 213C may generate the control code signal ICARR<0> synchronized with a rising edge of the clock signal CLK.

The inverting unit 215C may generate the control code signal ICARRB<0> by inverting the control code signal ICARR<0>. The control code signal ICARRB<0> may be generated in synchronization with a rising edge of the clock signal CLK.

The second synchronization unit 217C may generate the control code signal ICAFF<0> based on the buffered first control code signal ICA<0> and the second control clock signal IMCLKF. That is, the second synchronization unit 217C may generate the control code signal ICAFF<0> synchronized with a falling edge of the clock signal CLK.

Since the second control command input circuit 210D illustrated in FIG. 2 can be designed in the same manner as the first control command input circuit 210C illustrated in FIG. 5, the detailed descriptions of the second control command input circuit 210D are omitted herein.

Figure 6:
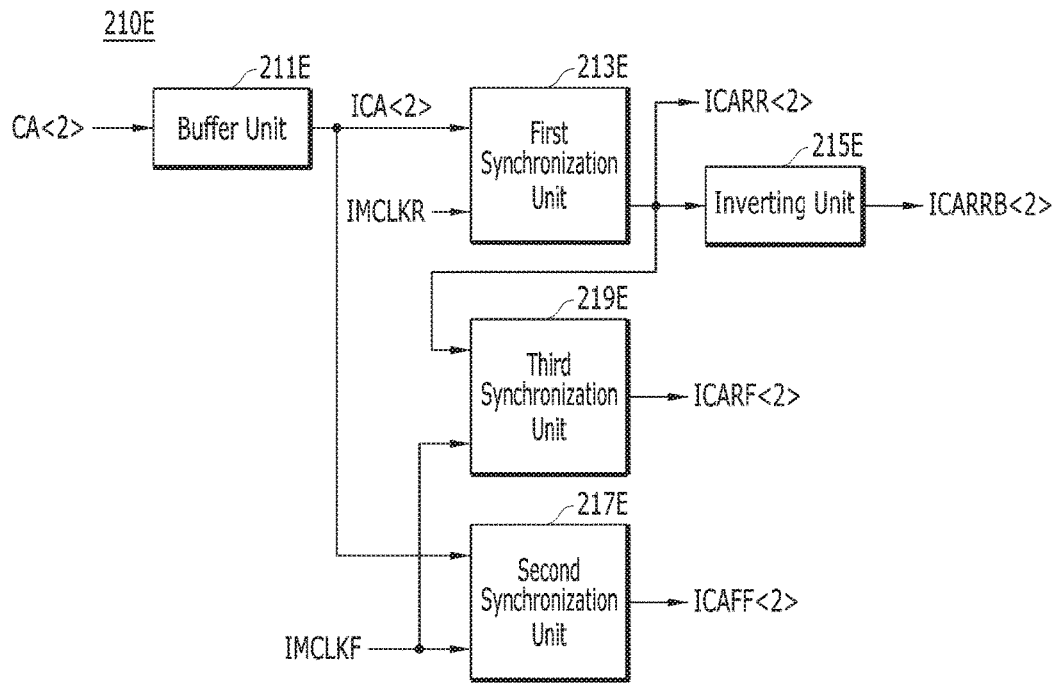
FIG. 6 is a block diagram illustrating a third control command input circuit in accordance with an embodiment.

FIG. 6 is a block diagram illustrating a third control command input circuit in accordance with an embodiment, for example, the third control command input circuit 210E of FIG. 2.

Referring to FIG. 6, the third control command input circuit 210E may include a buffer unit 211E, a first synchronization unit 213E, an inverting unit 215E, a second synchronization unit 217E and a third synchronization unit 219E.

The buffer unit 211E may generate a buffered third control command signal ICA<2> based on the third control command signal CA<2>.

The first synchronization unit 213E may generate the control code signal ICARR<2> based on the buffered third control command signal ICA<2> and the first control clock signal IMCLKR. That is, the first synchronization unit 213E may generate the control code signal ICARR<2> synchronized with a rising edge of the clock signal CLK.

The inverting unit 215E may generate the control code signal ICARRB<2> by inverting the control code signal ICARR<2>. The control code signal ICARRB<2> may be generated in synchronization with a rising edge of the clock signal CLK.

The second synchronization unit 217E may generate the control code signal ICAFF<2> based on the buffered third control code signal ICA<2> and the second control clock signal IMCLKF. That is, the second synchronization unit 217E may generate the control code signal ICAFF<2> synchronized with a falling edge of the clock signal CLK.

The third synchronization unit 219E may generate the control code signal ICARF<2> based on the control code signal ICARR<2> and the second control clock signal IMCLKF. That is, the third synchronization unit 219E may generate the control code signal ICARF<2> synchronized with a falling edge of the clock signal CLK.

Since the fourth to sixth control command input circuit 210F to 210I illustrated in FIG. 2 can be designed in the same manner as the third control command input circuit 210E illustrated in FIG. 6, the detailed descriptions of the fourth to sixth control command input circuit 210F to 210I are omitted herein.

Figure 7:
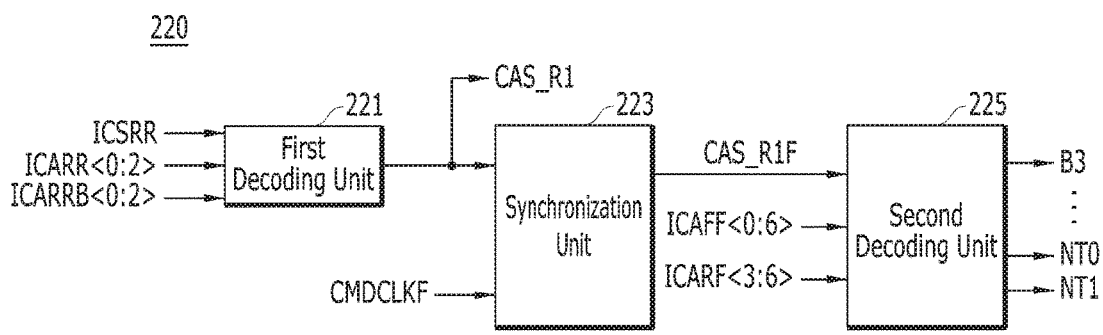
FIG. 7 is a block diagram illustrating a holding control circuit in accordance with an embodiment.

FIG. 7 is a block diagram illustrating a holding control circuit in accordance with an embodiment, for example, the holding control circuit 220 of FIG. 2.

Referring to FIG. 7, the holding control circuit 220 may include a first decoding unit 221, a synchronization unit 223 and a second decoding unit 225.

The first decoding unit 221 may generate the holding control signal CAS_R1 based on the select code signal ICSRR, the control code signals ICARR<0:2>, and the control code signals ICARRB<0:2>, during the holding period. For example, the first decoding unit 221 may generate the holding control signal CAS_R1 at a time point corresponding to a rising edge of the clock signal CLK in the holding period.

The synchronization unit 223 may generate a synchronized holding control signal CAS_R1F based on the holding control signal CAS_R1 and the third control clock signal CMDCLKF. For example, the synchronization unit 223 may generate the synchronized holding control signal CAS_R1F at a time point corresponding to a falling edge of the clock signal CLK in the holding period.

The second decoding unit 225 may generate the plurality of option setting information signals B3, . . . , NT0 and NT1 based on the synchronized holding control signal CAR_R1F, the control code signals ICAFF<0:6>, and the control code signals ICARF<3:6>, during the holding period. For example, the second decoding unit 225 may generate the plurality of option setting information signals B3, . . . , NT0 and NT1 at a time point corresponding to a rising edge of the clock signal CLK in the holding period.

Figure 8:
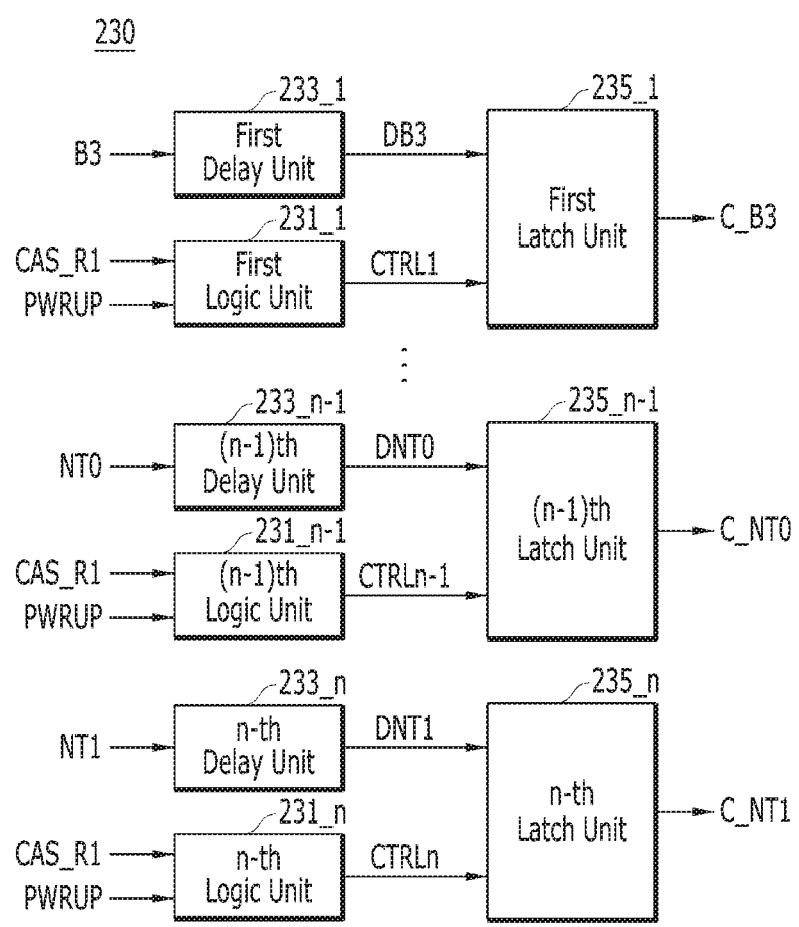
FIG. 8 is a block diagram illustrating a holding circuit in accordance with an embodiment.

FIG. 8 is a block diagram illustrating a holding circuit in accordance with an embodiment, for example, the holding circuit 230 of FIG. 2.

Referring to FIG. 8, the holding circuit 230 may include a plurality of logic units 231_1 to 231_n, a plurality of delay units 233_1 to 233_n and a plurality of latch units 235_1 to 235_n. Hereafter, the first logic unit 231_1, the first delay unit 233_1 and the first latch unit 235_1, which are related to the first option setting information signal B3, will be representatively described for convenience of description.

The first logic unit 231_1 may generate a first reset signal CTR1 based on the holding control signal CAS_R1 and the power-up signal PWRUP. For example, the first logic unit 231_1 may include an OR gate which performs an OR operation on the holding control signal CAS_R1 and the power-up signal PWRUP, and outputs the first reset signal CTRL1.

The first delay unit 233_1 may generate a delayed first option setting information signal DB3 by delaying the first option setting information signal B3 by the predetermined delay time.

The first latch unit 235_1 may reset the held first option setting information signal C_B3 to a predetermined logic level based on the first reset signal CTRL1, and then latch the delayed first option setting information signal DB3 as the held first option setting information signal C_B3, during the holding period.

For example, the first latch unit 235_1 may include an SR latch which deactivates the held first option setting information signal C_B3 based on the first reset signal CTRL1, and activates the held first option setting information signal C_B3 based on the delayed first option setting information signal DB3.

Figure 9:
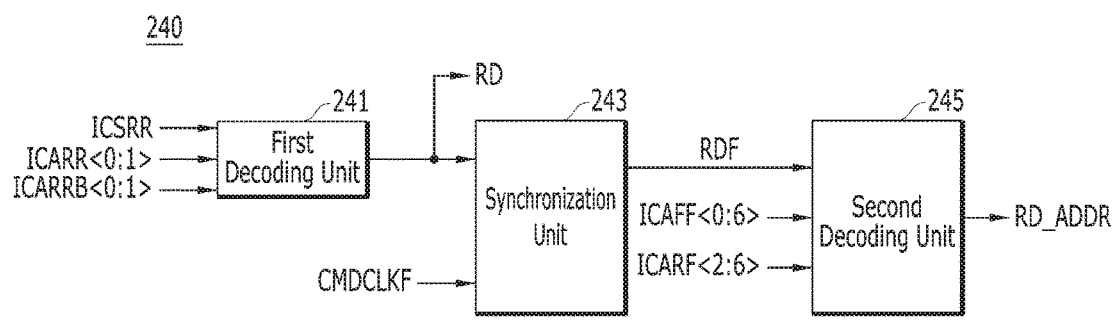
FIG. 9 is a block diagram illustrating a read control circuit in accordance with an embodiment.

FIG. 9 is a block diagram illustrating a read control circuit in accordance with an embodiment, for example, the read control circuit 240 of FIG. 2.

Referring to FIG. 9, the read control circuit 240 may include a first decoding unit 241, a synchronization unit 243 and a second decoding unit 245.

The first decoding unit 241 may generate the read mode signal RD based on the select code signal ICSRR, the control code signals ICARR<0:1>, and the control code signals ICARRB<0:1> during the read operation period. For example, the first decoding unit 241 may generate the read mode signal RD at a time point corresponding to a rising edge of the clock signal CLK in the read operation period.

The synchronization unit 243 may generate a synchronized read mode signal RDF based on the read mode signal RD and the third control clock signal CMDCLKF. For example, the synchronization unit 243 may generate the synchronized read mode signal RDF at a time point corresponding to a falling edge of the clock signal CLK in the read operation period.

The second decoding unit 245 may generate the read address signal RD_ADDR based on the synchronized read mode signal RDF, the control code signals ICAFF<0:6>, and the control code signals ICARF<2:6>, during the read operation period. For example, the second decoding unit 245 may generate the read address signal RD_ADDR at a time point corresponding to a falling edge of the clock signal CLK in the read operation period.

Figure 10:
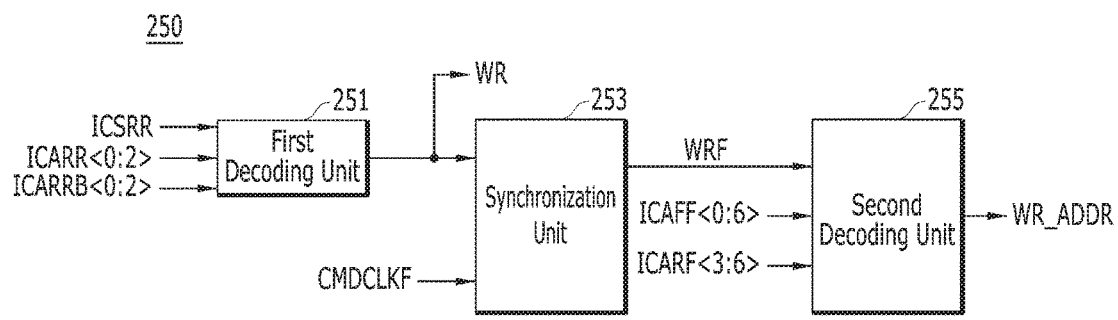
FIG. 10 is a block diagram illustrating a write control circuit in accordance with an embodiment.

FIG. 10 is a block diagram illustrating a write control circuit in accordance with an embodiment, for example, the write control circuit 250 of FIG. 2.

Referring to FIG. 10, the write control circuit 250 may include a first decoding unit 251, a synchronization unit 253 and a second decoding unit 255.

The first decoding unit 251 may generate the write mode signal WR based on the select code signal ICSRR, the control code signals ICARR<0:2>, and the control code signals ICARRB<0:2> during the write operation period. For example, the first decoding unit 251 may generate the write mode signal WR at a time point corresponding to a rising edge of the clock signal CLK in the read operation period.

The synchronization unit 253 may generate a synchronized write mode signal WRF based on the write mode signal WR and the third control clock signal CMDCLKF. For example, the synchronization unit 253 may generate the synchronized write mode signal WRF at a time point corresponding to a falling edge of the clock signal CLK in the write operation period.

The second decoding unit 255 may generate the write address signal WR_ADDR based on the synchronized write mode signal WRF, the control code signals ICAFF<0:6>, and the control code signals ICARF<3:6>, during the write operation period. For example, the second decoding unit 255 may generate the write address signal WR_ADDR at a time point corresponding to a falling edge of the clock signal CLK in the write operation period.

Hereafter, the operation of the semiconductor system in accordance with the present embodiment will be described with reference to FIG. 11.

Figure 11:
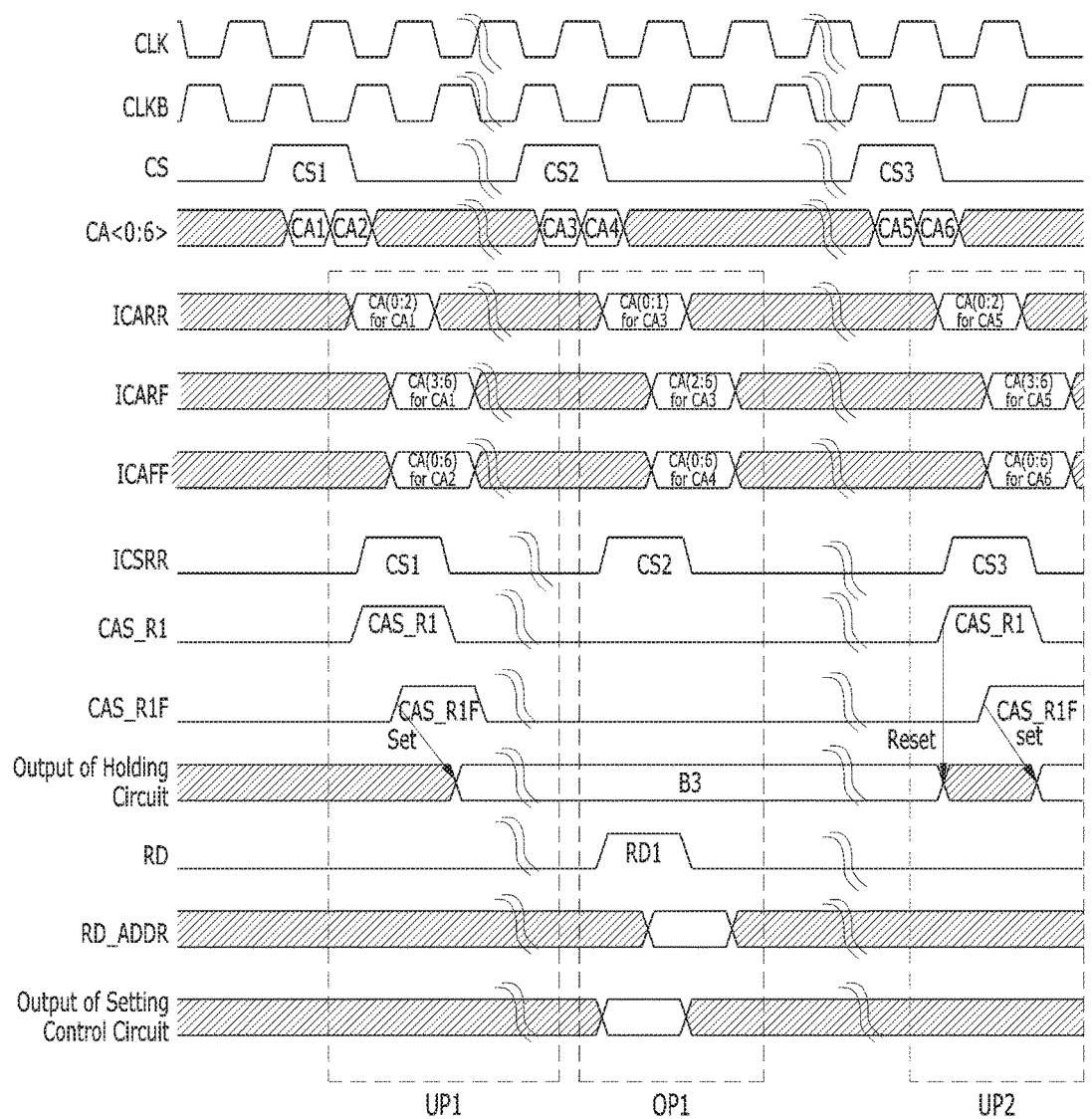
FIG. 11 is a timing diagram for illustrating an operation of a memory system in accordance with an embodiment.

FIG. 11 is a timing diagram for illustrating the operation of a memory system in accordance with an embodiment.

In the embodiment, the operation of the memory system will be described in the order of the first holding period UP1, the first operation period OP1 and the second holding period UP2. However, the order is not limited thereto. Furthermore, the embodiment may be based on the supposition that the first to seventh control command signals CA<0:6> corresponding to the read mode are generated during the first operation period OP1.

Referring to FIG. 11, the control device 100 of FIG. 1 may generate the differential clock signals CLK and CLKB, and output the generated differential clock signals CLK and CLKB to the memory device 200. The control device 100 may generate the select command signal CS synchronized with a rising edge of the first clock signal CLK between the differential clock signals CLK and CLKB. The control device 100 may successively generate the first to seventh control command signals CA<0:6> (e.g., CA1, CA3 or CA5) synchronized with a rising edge of the first clock signal CLK and the first to seventh control command signals CA<0:6> (e.g., CA2, CA4 or CA6) synchronized with a falling edge of the first clock signal CLK for each command set.

The control device 100 may generate the first to seventh control command signals CA<0:6> (e.g., CA1 and CA2) corresponding to a first option setting information set during the first holding period UP1, generate the first to seventh control command signals CA<0:6> (e.g., CA3 and CA4) corresponding to the read mode during the first operation period OP1, and generate the first to seventh control command signals CA<0:6> (e.g., CA5 and CA6) corresponding to a second option setting information set during the second holding period UP2.

The memory device 200 may hold the first to seventh control command signals CA<0:6> (e.g., CA1 and CA2) received at the first holding period UP1. For example, the memory device 200 may retain the first to seventh control command signals CA<0:6> (e.g., CA1 and CA2) during the first holding period UP1 and the first operation period OP1.

The memory device 200 may perform an operation according to the first option setting information set and the read mode, based on the first to seventh control command signals CA<0:6> (e.g., CA3 and CA4) received at the first operation period OP1 and the held first to seventh control command signals CA<0:6> (e.g., CA1 and CA2). For example, the memory device 200 may output read data to the control device 100 according to a preset burst sequence.

The memory device 200 may reset the previously held first to seventh control command signals CA<0:6> (e.g., CA1 and CA2) and hold the first to seventh control command signals CA<0:6> (e.g., CA5 and CA6), according to the first to seventh control command signals CA<0:6> (e.g., CA5 and CA6) received at the second holding period UP2.

Although not illustrated, the control device 100 may generate the first to seventh command signals CA<0:6> corresponding to the second operation mode (i.e., the read mode or the write mode) during the second operation period. For example, the second operation period may be present between the first operation period OP1 and the second holding period UP2.

In this case, the memory device 200 may retain the first to seventh control command signals CA<0:6> (e.g., CA1 and CA2) received at the first holding period UP1 during the first holding period UP1, the first operation period OP1 and the second operation period. Furthermore, the memory device 200 may perform an operation according to the first option setting information set and the second read mode, based on the first to seventh control command signals CA<0:6> received at the second operation period and the held first to seventh control command signals CA<0:6> (e.g., CA1 and CA2).

Although not illustrated, the control device 100 may generate the first to seventh command signals CA<0:6> corresponding to a third operation mode (i.e., the read mode or the write mode) during a third operation period. For example, the third operation period may be present after the second holding period UP2.

In this case, the memory device 200 may hold the first to seventh control command signals CA<0:6> (e.g., CA5 and CA6) received at the second holding period UP2 during the second holding period UP2 and the third operation period. The memory device 200 may perform an operation according to the second option setting information set and the third operation mode, based on the first to seventh control command signals CA<0:6> received at the third operation period and the held first to seventh control command signals CA<0:6> (e.g., CA5 and CA6).

Figure 12:
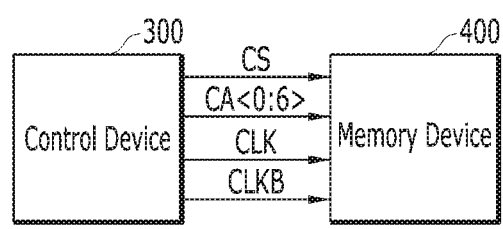
FIG. 12 is a block diagram illustrating a memory system in accordance with an embodiment.

FIG. 12 is a block diagram illustrating a memory system in accordance with an embodiment.

Referring to FIG. 12, the memory system may include a control device 300 and a memory device 400.

Since the control device 300 can be configured in the same manner as the control device 100 described with reference to the first embodiment in FIGS. 1 to 11, the detailed descriptions thereof are omitted herein.

Since the memory device is configured in a similar manner to the memory device 200 described with reference to the embodiment in FIGS. 1 to 11, the following descriptions will be focused on different components from the memory device 200.

Figure 13:
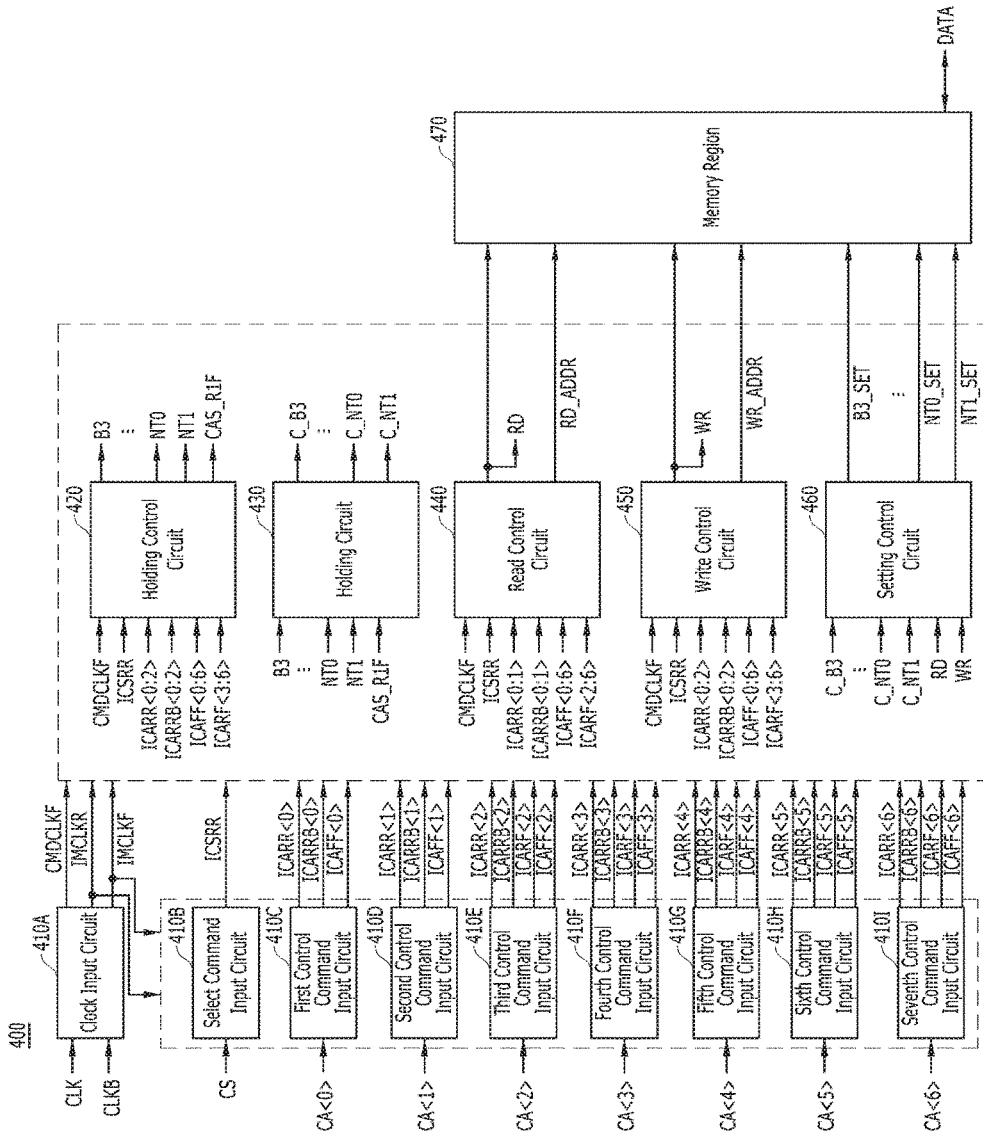
FIG. 13 is a block diagram illustrating a memory device in accordance with an embodiment.

FIG. 13 is a block diagram illustrating a memory device in accordance with an embodiment, for example, the memory device 400 of FIG. 12.

Referring to FIG. 13, the memory device 400 may include a clock input circuit 410A, a select command input circuit 410B, first to seventh control command input circuits 410C to 410I, a holding control circuit 420, a holding circuit 430, a read control circuit 440, a write control circuit 450, a setting control circuit 460 and a memory region 470.

Figure 14:
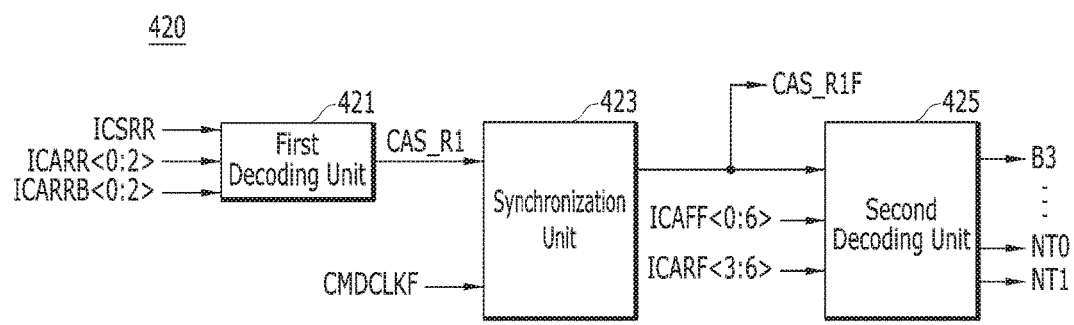
FIG. 14 is a block diagram illustrating a holding control circuit in accordance with an embodiment.

FIG. 14 is a block diagram of a holding control circuit in accordance with an embodiment, for example, the holding control circuit 420 illustrated in FIG. 13.

Referring to FIG. 14, the holding control circuit 420 may include a first decoding unit 421, a synchronization unit 423 and a second decoding unit 425.

The first decoding unit 421 may generate the holding control signal CAS_R1 based on the select code signal ICSRR, the control code signals ICARR<0:2>, and the control code signals ICARRB<0:2> during the holding period. For example, the first decoding unit 421 may generate the holding control signal CAS_R1 at a time point corresponding to a rising edge of the clock signal CLK in the holding period.

The synchronization unit 423 may generate a synchronized holding control signal CAS_R1F based on the holding control signal CAS_R1 and the third control clock signal CMDCLKF. For example, the synchronization unit 423 may generate the synchronized holding control signal CAS_R1F at a time point corresponding to a falling edge of the clock signal CLK in the holding period.

The second decoding unit 425 may generate the plurality of option setting information signals B3, . . . , NT0 and NT1 based on the synchronized holding control signal CAS_R1F, the control code signals ICAFF<0:6>, and the control code signals ICARF<3:6>, during the holding period. For example, the second decoding unit 425 may generate the plurality of option setting information signals B3, . . . , NT0 and NT1 at a time point corresponding to a falling edge of the clock signal CLK in the holding period.

Figure 15:
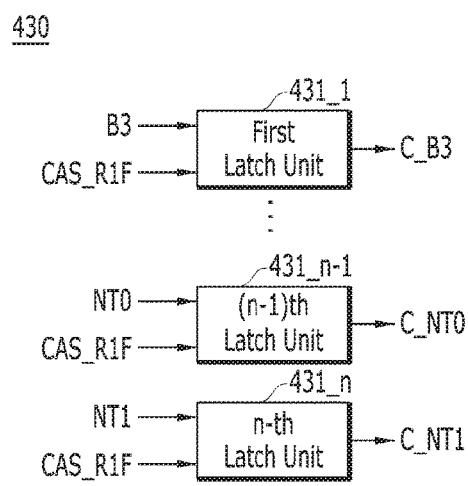
FIG. 15 is a block diagram illustrating a holding circuit in accordance with an embodiment.

FIG. 15 is a block diagram illustrating a holding circuit in accordance with an embodiment, for example, the holding circuit 430 of FIG. 13.

Referring to FIG. 15, the holding circuit 430 may include a plurality of latch units 431_1 to 431_n. Hereafter, the first latch unit 431_1 related to the first option setting information signal B3 will be representatively described for convenience of description.

The first latch unit 431_1 may latch the first option setting information signal B3 as the held first option setting information signal C_B3 based on the synchronized holding control signal CAS_R1F, during the holding period. For example, the first latch unit 431_1 may include an asynchronous latch.

Figure 16:
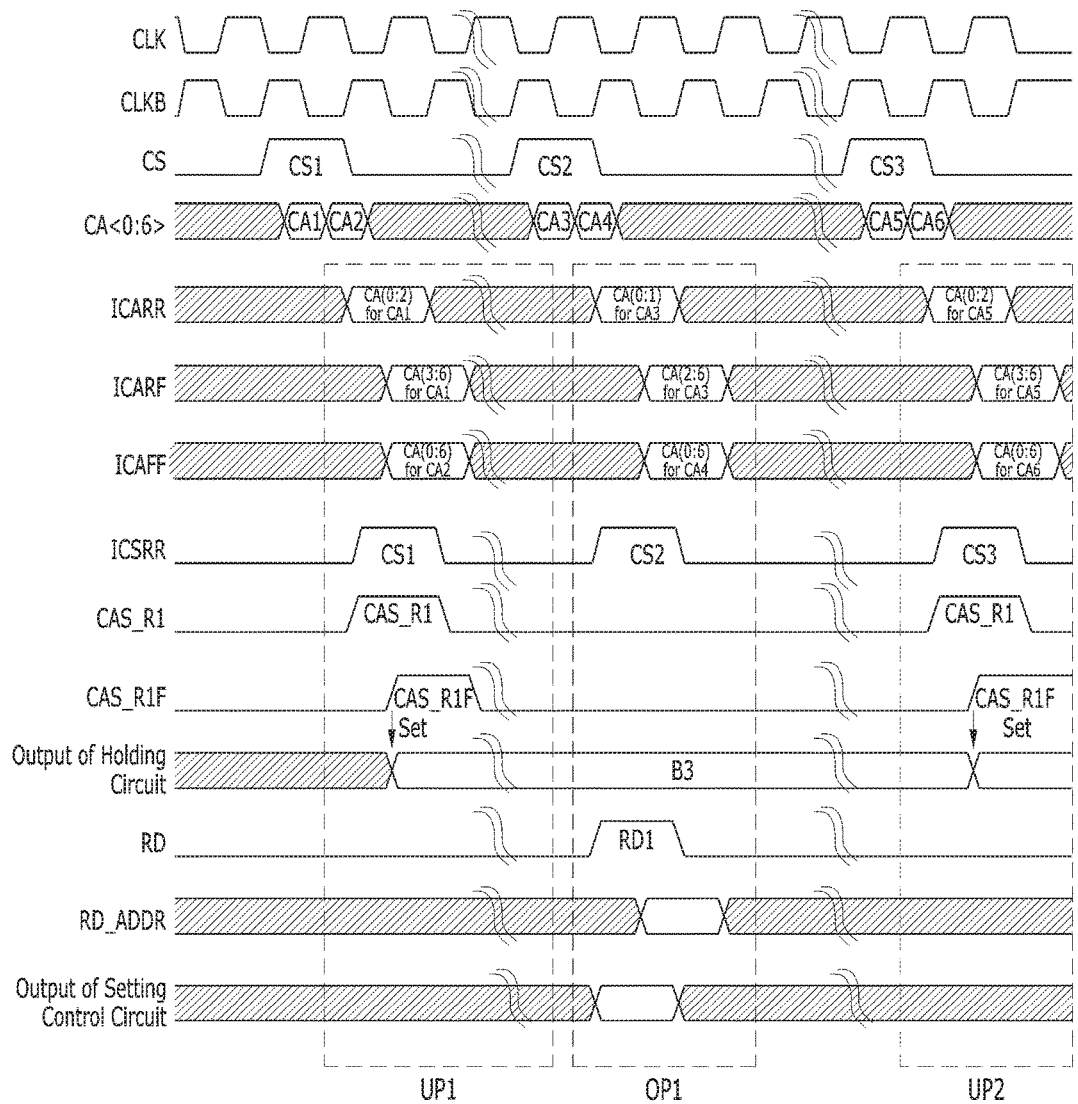
FIG. 16 is a timing diagram for illustrating an operation of a memory system in accordance with an embodiment.

FIG. 16 is a timing diagram for illustrating the operation of a memory system in accordance with an embodiment.

Since the operation of the memory system in accordance with the embodiment of FIG. 16 is very similar to the operation of the memory system in accordance with the embodiment of FIG. 11, the detailed descriptions thereof are omitted herein. As illustrated in FIG. 16, however, the memory device 400 may hold or update the plurality of option setting information signals B3, NT0 and NT1 at the point of time that the synchronized holding control signal CAS_R1F is activated.

In accordance with the present embodiments, the memory system can properly generate and use the command signals related to the option setting information and the command signals related to the operation mode, when the signals are needed.

Figure 17:
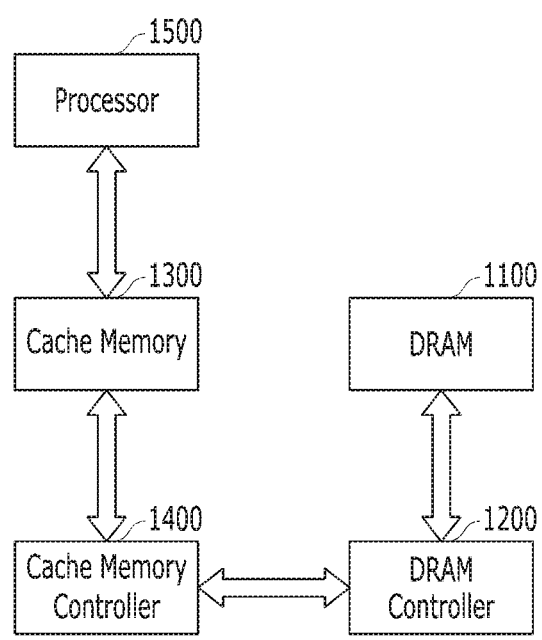
FIG. 17 is a block diagram illustrating an example in which a memory system in accordance with an embodiment is applied.

FIG. 17 is a block diagram illustrating an example in which a memory system in accordance with an embodiment is applied.

Referring to FIG. 17, the memory system may include a dynamic random access memory (DRAM) 1100, a DRAM controller 1200, a cache memory 1300, a cache memory controller 1400 and a processor 1500.

The DRAM 1100 may exchange a data signal with the DRAM controller 1200 according to control of the DRAM controller 1200. The DRAM 1100 may correspond to the memory devices 200 and 400 in accordance with the present embodiments.

The DRAM controller 1200 may exchange the data signal with the cache memory controller 1400. The DRAM controller 1200 may control the operation of the DRAM 1100. The DRAM controller 1200 may correspond to the control devices 100 and 200 in accordance with the present embodiments.

The cache memory 1300 may exchange the data signal with the processor 1500 according to control of the cache memory controller 1400. For example, the cache memory 1300 may include a static random access memory (SRAM).

The cache memory controller 1400 may exchange the data signal with the cache memory 1300. The cache memory controller 1400 may control the operation of the cache memory 1300 and the operation of the DRAM controller 1200.

Typically, the cache memory 1300 which directly communicates with the processor 1500 may have a higher processing speed than the DRAM 1100, and the DRAM 1100 which indirectly communicates with the processor 1500 may have a larger size than the cache memory 1300. As described above, the cache memory 1300 may include the SRAM. Since the SRAM has a simpler operation process than the DRAM while the latency of the SRAM is shorter than the latency of the DRAM, the SRAM has an advantage in terms of power consumption. In other words, the power overhead of the DRAM per unit area may be larger than that of the SRAM.

The DRAM controller 1200 may generate a command signal for controlling the DRAM 1100. Since the number of pads included in the DRAM controller 1200 tends to be decreased in order to reduce the area of the DRAM 1100, the DRAM controller 1200 needs to generate a command signal with a relatively small number of bits. In order to compensate for the command signal with a small number of bits, the command signal needs to be generated a plurality of times. As such, with the increase in the number of times that the command signal is generated, the throughput of the DRAM controller 1200 and the DRAM 1100 which process the command signals may be increased, and the power overhead used by the DRAM controller 1200 and the DRAM 1100 may also be increased.

However, when the command signal can be optimized to decrease the number of times that the command signal is generated, the throughput and power overhead of the DRAM controller 1200 and the DRAM 1100 can be reduced.

In accordance with the present embodiments, the memory device and the memory system can properly generate and use the command signals classified according to the uses, when the commands signals are required. Therefore, the memory device and the memory system can improve the processing speed performance and reduce the power overhead.

Although various embodiments have been described for illustrative purposes, it will be apparent to those skilled in the art that various changes and modifications may be made without departing from the spirit and scope of the invention as defined in the following claims.

What is claimed is:

1. A memory device comprising:
   a holding control circuit suitable for generating a holding control signal and an option setting information signal, based on a first command signal;
   a holding circuit suitable for generating a held option setting information signal based on the holding control signal and the option setting information signal;
   an operation control circuit suitable for generating an operation mode signal based on a second command signal;
   a setting control circuit suitable for generating a setting control signal based on the operation mode signal and the held operation setting information signal; and
   a memory region suitable for performing an operation based on the setting control signal and the operation mode signal.

2. The memory device of claim 1, wherein the holding control circuit generates the holding control signal and the option setting information signal during a holding period, and
   the operation control circuit generates the operation mode signal one or more times during at least one operation period following the holding period.

3. The memory device of claim 1, wherein the holding circuit generates the held option setting information signal during a holding period, and retains the held option setting information signal during at least one operation period following the holding period.

4. The memory device of claim 3, wherein the setting control circuit generates the setting control signal once during the at least one operation period as one operation period, or generates the setting control signal a plurality of times during the at least one operation period as a plurality of operation periods.

5. A memory device comprising:
   a holding control circuit suitable for generating a holding control signal and an option setting information signal based on a first command signal, during a holding period;
   a holding circuit suitable for generating a held option setting information signal based on the holding control signal and the option setting information signal during the holding period, and retaining the held option setting information signal during an operation period following the holding period;
   an operation control circuit suitable for generating an operation mode signal and an address signal based on a second command signal, during the operation period;
   a setting control circuit suitable for generating a setting control signal based on the held option setting information signal and the operation mode signal, during the operation period; and
   a memory region suitable for performing a write operation or read operation based on the setting control signal, the operation mode signal and the address signal.

6. The memory device of claim 5, wherein the holding control circuit generates the holding control signal synchronized with a rising edge of a clock signal, and generates the option setting information signal synchronized with a falling edge of the clock signal.

7. The memory device of claim 5, wherein the first command signal comprises one or more first code signals and one or more second code signals, and
   wherein the holding control circuit comprises:
   a first decoding unit suitable for generating the holding control signal based on the first code signal;
   a synchronization unit suitable for generating a synchronized holding control signal by synchronizing the holding control signal with a control clock signal; and
   a second decoding unit suitable for generating the option setting information signal based on the holding control signal and the second code signal.

8. The memory device of claim 7, wherein the first code signal is received in synchronization with a rising edge of a dock signal, and
   the second code signal is received in synchronization with a falling edge of the clock signal.

9. The memory device of claim 5, wherein the holding circuit comprises:
   a logic unit suitable for generating a reset signal based on the holding control signal and a power-up signal;
   a delay unit suitable for generating a delayed option setting information signal by delaying the option setting information signal by a predetermined delay time; and
   a latch unit suitable for resetting the held option setting information signal based on the reset signal, and latching the delayed option setting information signal as the held option setting information signal.

10. The memory device of claim 9, wherein the latch unit comprises an SR latch.

11. A memory device comprising:
    a holding control circuit suitable for generating a synchronized holding control signal and an option setting information signal based on a first command signal including one or more first code signals and one or more second code signals, during a holding period;
    a holding circuit suitable for generating a held option setting information signal based on the synchronized holding control signal and the option setting information signal during the holding period, and retaining the held option setting information signal during an operation period following the holding period;
    an operation control circuit suitable for generating an operation mode signal and an address signal based on a second command signal, during the operation period;
    a setting control circuit suitable for generating a setting control signal based on the held operation setting information signal and the operation mode signal, during the operation period; and a memory region suitable for performing a write operation or read operation based on the setting control signal, the operation mode signal and the address signal, wherein the holding control circuit comprises:

a first decoding unit suitable for generating the holding control signal based on the first code signal;

a synchronization unit suitable for generating a synchronized holding control signal by synchronizing the holding control signal with a control clock signal; and a second decoding unit suitable for generating the option setting information signal based on the synchronized holding control signal and the second code signal, and the holding circuit comprises an asynchronous latch.

12. The memory device of claim 11, wherein the holding control circuit outputs the synchronized holding control signal and the option setting information signal in synchronization with a predetermined edge of a clock signal.

13. The memory device of claim 11, wherein the first code signal is received in synchronization with a rising edge of a clock signal, the second code signal is received in synchronization with a falling edge of the clock signal, and the control clock signal is synchronized with a falling edge of the clock signal.

14. A memory system comprising:

a control device suitable for generating a first command signal corresponding to first option setting information during a first holding period, and generating a second command signal corresponding to a first operation mode during a first operation period; and a memory device suitable for holding the first command signal, and performing an operation according to the first option setting information and the first operation mode based on the second command signal and the held first command signal.

15. The memory system of claim 14, wherein the control device generates a third command signal corresponding to a second operation mode during a second operation period, and the memory device performs an operation according to first operation setting information and the second operation mode, based on the third command signal and the held first command signal.

16. The memory system of claim 14, wherein the control device generates a fourth command signal corresponding to second option setting information during a second holding period, and generates a fifth command signal corresponding to a third operation mode during a third operation period, and the memory device holds the fourth command signal, and performs an operation according to the second option setting information and the third operation mode based on the fifth command signal and the held fourth command signal.

17. An operating method for a memory system comprising:

generating, by a control device, a first command signal corresponding to first option setting information during a first holding period, and generating a second command signal corresponding to a first operation mode during a first operation period; and holding the first command signal and performing an operation, by a memory device, according to the first option setting information and the first operation mode based on the second command signal and the held first command signal.

18. The method of claim 17, further comprising:

generating a third command signal, by the control device, corresponding to a second operation mode during a second operation period, and performing an operation, by the memory device, according to first operation setting information and the second operation mode, based on the third command signal and the held first command signal.

19. The method of claim 17, further comprising:

generating a fourth command signal, by the control device, corresponding to second option setting information during a second holding period, and generating a fifth command signal, by the control device, corresponding to a third operation mode during a third operation period, and by the memory device, holding the fourth command signal, and performing an operation, by the memory device, according to the second option setting information and the third operation mode based on the fifth command signal and the held fourth command signal.

* * * * *